(12) United States Patent
Lee

(10) Patent No.: US 11,778,756 B2
(45) Date of Patent: Oct. 3, 2023

(54) DISPLAY DEVICE

(71) Applicant: SAMSUNG DISPLAY CO., LTD., Yongin-si (KR)

(72) Inventor: Joon-Ik Lee, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 118 days.

(21) Appl. No.: 17/243,952

(22) Filed: Apr. 29, 2021

(65) Prior Publication Data
US 2022/0078925 A1    Mar. 10, 2022

(30) Foreign Application Priority Data

Sep. 9, 2020  (KR) .......................... 10-2020-0115465

(51) Int. Cl.
*H05K 5/00*    (2006.01)
*H05K 5/03*    (2006.01)

(52) U.S. Cl.
CPC ............. *H05K 5/0017* (2013.01); *H05K 5/03* (2013.01)

(58) Field of Classification Search
USPC ........................................ 361/807, 809, 810
See application file for complete search history.

(56) References Cited

U.S. PATENT DOCUMENTS

| 10,367,050 | B2 | 7/2019 | Choi et al. |
| 10,462,896 | B1 * | 10/2019 | Kwon .................... H10K 59/12 |
| 10,522,611 | B2 | 12/2019 | Jeon |
| 10,547,025 | B2 | 1/2020 | Choi et al. |
| 2018/0013095 | A1 * | 1/2018 | Choi .................... H01L 51/0097 |
| 2018/0059728 | A1 * | 3/2018 | Kim .................... H01L 51/0097 |
| 2020/0029423 | A1 * | 1/2020 | Kwon .................... G06F 1/1652 |
| 2020/0144354 | A1 | 5/2020 | Jeon |
| 2021/0136911 | A1 * | 5/2021 | Song ................ G02F 1/133305 |

FOREIGN PATENT DOCUMENTS

| CN | 113363297 | * | 9/2021 | .......... G06F 1/1345 |
| KR | 10-2017-0047713 | | 5/2017 | |
| KR | 10-2017-0132382 | | 12/2017 | |
| KR | 10-2018-0005313 | | 1/2018 | |

* cited by examiner

*Primary Examiner* — Hung S. Bui
(74) *Attorney, Agent, or Firm* — F. Chau & Associates, LLC

(57) ABSTRACT

A display device includes a display panel and a panel protective layer. The display panel has a first area and a second area. The first area is parallel to a plane including a first direction crossing a second direction. The second area extends from the first area and includes: a first part adjacent to the first area in the second direction, a second part extending from the first part and in a bent state, and a third part extending from the second part and disposed below the first part. The panel protective layer is between the first part and the third part. A distance between the first part and the third part decreases from an end of the third part toward the second part along the second direction.

19 Claims, 7 Drawing Sheets

DISPLAY DEVICE

CROSS-REFERENCE TO RELATED APPLICATIONS

This U.S. non-provisional patent application claims priority under 35 U.S.C. § 119 of Korean Patent Application No. 10-2020-0115465, filed on Sep. 9, 2020, the entire contents of which are hereby incorporated by reference.

BACKGROUND

1. Field of the Disclosure

One or more embodiments described herein relates to a display device.

2. Description of the Related Art

Various electronic devices have been developed to include displays. Examples include televisions, mobile phones, tablet computers, navigation devices, and game consoles. Some of these displays are planar, while other displays are flexible. Examples of flexible displays include curved displays, bendable displays, foldable displays, rollable displays, and stretchable displays.

SUMMARY

One or more embodiments described herein provide a display device capable of minimizing a radius of curvature of a bending area of a display panel.

In accordance with one or more embodiments of the inventive concept, a display device includes a display panel comprising a first area and a second area, the first area parallel to a plane including a first direction crossing a second direction, and the second area extending from the first area and comprising a first part adjacent to the first area in the second direction, a second part extending from the first part and in a bent state, and a third part extending from the second part and below the first part. The display device also includes a panel protective layer between the first part and the third part, and a distance between the first part and the third part decreases from an end of the third part toward the second part along the second direction.

In accordance with one or more embodiments of the invention concept, a display device includes a display panel comprising a first area and a second area, the first area parallel to a plane formed by a first direction crossing a second direction, and the second area extending from the first area and comprising a first part adjacent to the first area in the second direction, a second part extending from the first part and in a bent state, and a third part extending from the second part and below the first part. The display panel also comprises a panel protective layer between the first part and the third part, and the panel protective layer has a thickness that decreases from an end of the third part toward the second part along the second direction.

In accordance with one or more embodiments, a display panel includes a first area including a display area and a second area in a bent state and coupled to the first area. The second area includes a first part aligned in a plane including the display area, a second part that is curved, and a third part that is inclined relative to the first area. A first distance between a first point of the first part and a first location of the third part is less than a second distance between a second point of the first part and a second location of the third part, and the first point and the first location are closer to the second part than the second point and the second location.

BRIEF DESCRIPTION OF THE FIGURES

The accompanying drawings provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
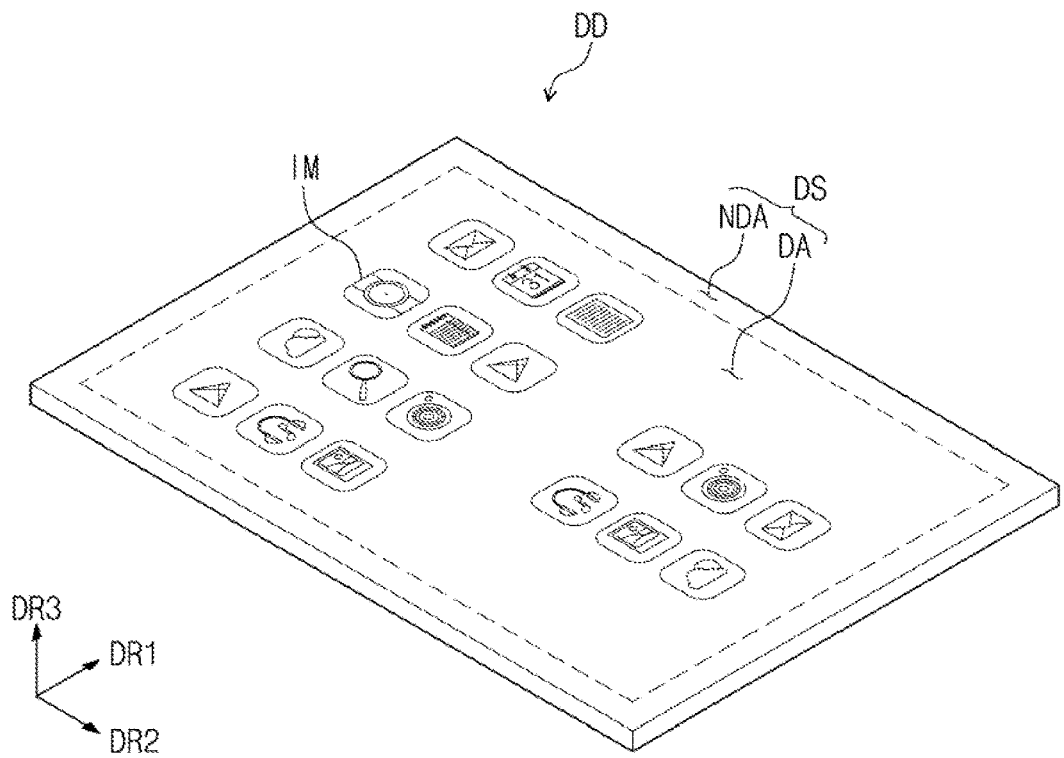
FIG. 1 illustrates an embodiment of a display device.

In the specification, it will be understood that when an element (or an region, a layer, a portion, or the like) is referred to as being "on", "connected to" or "coupled to" another element in the specification, it can be directly disposed on, connected or coupled to another element mentioned above, or intervening elements may be disposed therebetween. Like numbers refer to like elements throughout. Also, in the drawings, the thicknesses, ratios, and dimensions of the elements are exaggerated for effective description of the technical contents. The term "and/or" includes any and all combinations of one or more of the associated listed items. As used herein, the term "substantially" may correspond to a predetermined tolerance or slight variation of the word it is modifying.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the scope of the present disclosure. The singular forms include the plural forms unless the context clearly indicates otherwise. Also, terms such as "below", "lower", "above", and "upper" may be used to describe the relationships of the components illustrated in the drawings. These terms have a relative concept and are described on the basis of the directions indicated in the drawings.

Unless otherwise defined, all terms (including technical and scientific terms) used herein have like meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

FIG. 1 is a perspective view of an embodiment of a display device DD according to the inventive concept. The display device DD may generate and output an image to a user. The display panel DD may have various shapes. For example, the display panel DD may have two short sides extending in a first direction DR1 and two long sides extending in a second direction DR2 crossing the first direction DR1. Thus, when viewed in a plan view, the display device DD may have a rectangular shape. In another embodiment, the display device DD may have a different shape, e.g., a circle, a polygon, or another shape.

A third direction DR3 may substantially perpendicularly cross a plane formed by the first direction DR1 and the second direction DR2. In this description, the meaning of "when viewed in a plan view" may represent the state when viewed in the third direction DR3.

The display device DD may have a top surface corresponding to a display surface DS. Images IM generated in the display device DD may be provided to a user through the display surface DS. As illustrated in FIG. 1, the display surface DS may have a plane defined by the first direction DR1 and the second direction DR2.

The display surface DS may include a display area DA and a non-display area NDA around the display area DA. The display area DA may display an image, and the non-display area NDA may not display an image. The non-display area NDA may surround the display area DA. The non-display area NDA may substantially correspond to a bezel of the display device DD.

Figure 2:
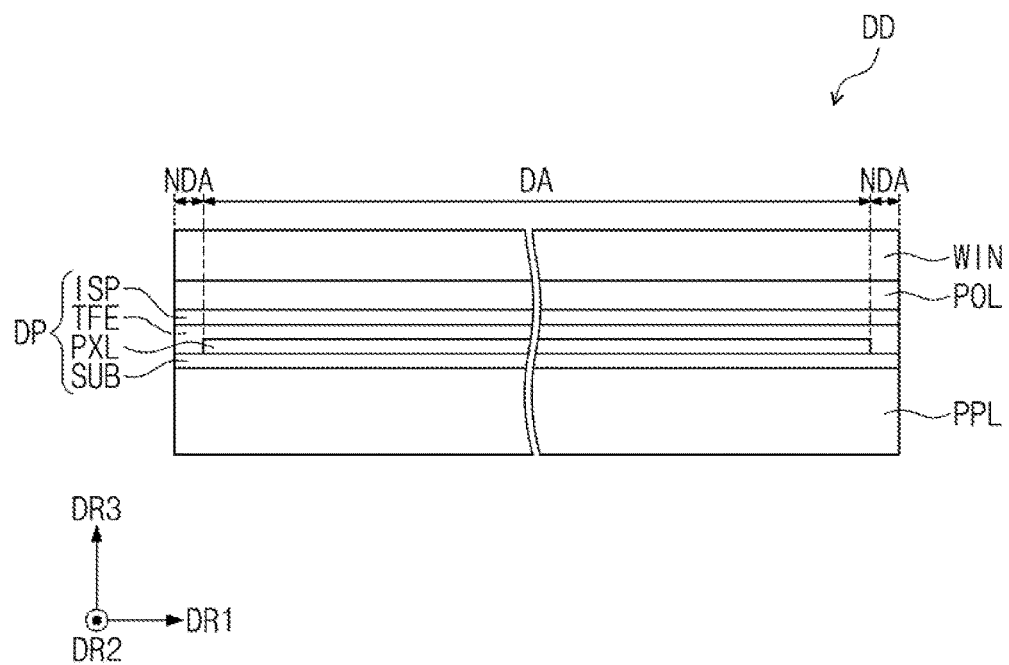
FIG. 2 illustrates showing another view of the display device of FIG. 1.

FIG. 2 is a cross-sectional view showing the display device DD of FIG. 1 according to an embodiment. Referring to FIG. 2, the display device DD may include a window WIN, an anti-reflection layer POL, a display panel DP, and a panel protective layer PPL.

The window WIN and the anti-reflection layer POL may be disposed above the display panel DP and may protect the display panel DP from scratches or external impact. The window WIN may be fixed to the anti-reflection layer POL. For example, an optically clear adhesive may be disposed between the window WIN and the anti-reflection layer POL. However, another type of adhesive or fastener may be used for this purpose in a different embodiment. The window WIN may include an optically clear material, e.g., glass or transparent plastic. The image generated in the display panel DP passes through the window WIN and then may be provided to the user.

The anti-reflection layer POL may be disposed between the window WIN and the display panel DP. In one embodiment, the anti-reflection layer POL may include a film to prevent external light from being reflected. The anti-reflection layer POL may reduce the reflectivity of external light which is incident toward the display panel DP from above the display device DD. The anti-reflection layer POL may include, for example, a phase retarder and/or a polarizer.

The display panel DP may display an image and sense an input of a user. For example, the display panel DP may include a substrate SUB, a pixel layer PXL on the substrate SUB, a thin film encapsulation layer TFE on the pixel layer PXL, and an input sensing part ISP on the thin film encapsulation layer TFE.

The substrate SUB may include a base layer of the display panel DP and may be a flexible substrate. In one embodiment, the substrate SUB may include polyimide (PI).

The pixels PXL may include a circuit element layer and a display element layer. The circuit element layer may include a plurality of signal lines, conductive patterns connected to the signal lines, and/or other features. The display element layer may include a light emitting element electrically connected to the circuit element layer. For example, the display element layer may include an organic light emitting material, a quantum dot, a quantum rod, micro LED, or another type of light emitter.

The thin film encapsulation layer TFE may protect the pixel layer PXL from external moisture, oxygen, foreign materials, or other foreign substances. To this end, the thin film encapsulation layer TFE may include a plurality of inorganic layers and organic layers between the inorganic layers.

The input sensing part ISP may include a plurality of sensors for sensing an external input. The sensors may sense the external input using, for example, a capacitive method. The external input may include various types of inputs generated, for example, by a portion of a user's body, light, heat, a pen, or pressure.

According to an embodiment, the display panel DP may be a flexible display panel. Each of the layers of the display panel DP described above may be a flexible layer. The panel protective layer PPL may be disposed below the display panel DP to protect the display panel DP. To this end, the panel protective layer PPL may include a plurality of functional layers. Embodiments of the structure of the panel protective layer PPL will be described below.

Figure 3:
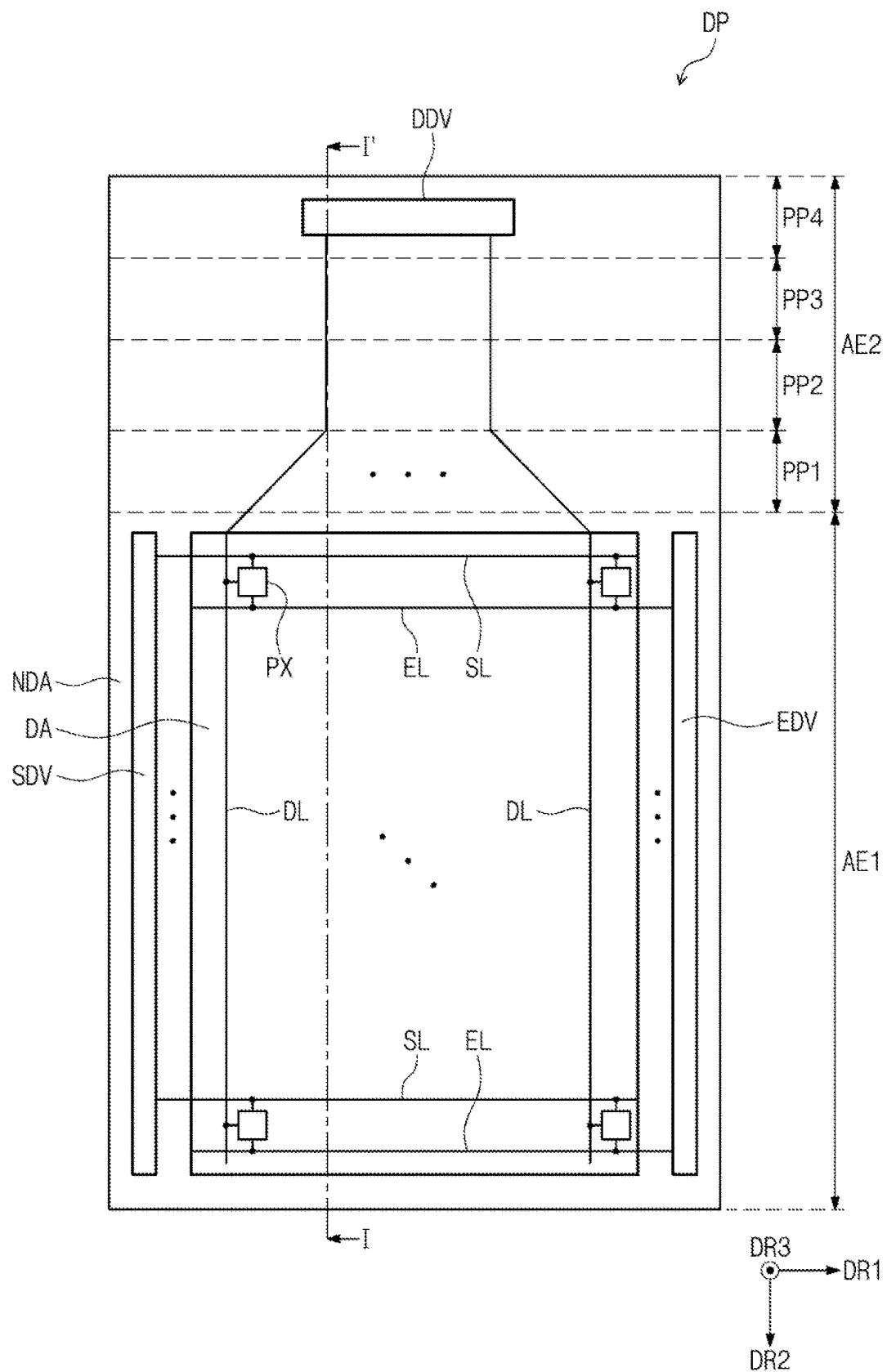
FIG. 3 illustrates an embodiment of a display panel.

FIG. 3 is a plan view showing an embodiment of the display panel DP of FIG. 2. For convenience of description, FIG. 3 illustrates an example of a state in which a second area AE2 is unfolded in the second direction DR2.

Referring to FIG. 3, when viewed in a plan view, the display panel DP according to an embodiment of the inventive concept may include a first area AE1 and a second area AE2. The first area AE1 may be substantially parallel to the plane defined by the first direction DR1 and the second direction DR2. The first area AE1 may include a display area DA and a non-display area NDA. The first area AE1 may include a number of pixels PX, signal lines SL, DL, and EL, a scan driver SDV, and an emission driver EDV. In one embodiment, the pixels PX and the signal lines SL, DL, and EL may be substantially subordinate components of the pixel layer PXL illustrated in FIG. 2.

The pixels PX may be arranged in a predetermined pattern, e.g., in matrix form or another type of arrangement. The pixels PX may arranged in the display area DA, and the scan driver SDV and emission driver EDV may be disposed in the non-display area NDA of the first area AE1. For example, the scan lines SL and emission lines EL may be in the first area AE1, and each of the scan lines SL and emission lines EL may extend in the first direction DR1. The scan lines SL may electrically connect the pixels PX to the scan driver SDV, and the emission lines EL may electrically connect the pixels PX to the emission driver EDV.

The first area AE1 may also include a number of data lines DL. Each of the data lines DL may extend in the second direction DR2, and a first end of each data line DL may be connected to a corresponding pixel PX.

According to an embodiment of the inventive concept, the second area AE2 of the display panel DP may extend from the first area AE1 in the second direction DR2. The second area AE2 may be the non-display area NDA that does not display an image. The second area AE2 may include the data lines DL and a data driver DDV. For example, the second area AE2 may extend from the first area AE1 in the second direction DR2. The second area AE2 may include a first part PP1, a second part PP2, a third part PP3, and a fourth part PP4 arranged in the second direction DR2. The data lines DL may extend from the first area AE1 to the first to fourth parts PP1 to PP4 of the second area AE2.

The data driver DDV may be disposed in the fourth part PP4. In one embodiment, the data driver DDV may be embodied in an integrated circuit chip disposed on the top surface of the fourth part PP4. A second end of each data line DL may be connected to the data driver DDV, to electrically connect a corresponding pixel PX to the data driver DDV.

According to the embodiment of the inventive concept, the scan driver SDV may generate a scan signal and may apply the scan signal to the pixels PX through corresponding ones of the scan lines SL. The scan signals may be applied to the pixels PX in a predetermined sequence or pattern, e.g., sequentially applied. The data driver DDV generates a plurality of data voltages and may apply the data voltages to the pixels PX through corresponding ones of the data lines DL. The emission driver EDV generates a light emission signal and may apply the light emission signal to the pixels PX through corresponding ones of the light emission lines EL.

The display panel DP may include a timing controller to control operation of the scan driver SDV, the data driver DDV, and the emission driver EDV. The timing controller may generate a scan control signal, a data control signal, and an emission control signal in response to control signals received, for example, from an external source. The timing controller may receive image signals, for example, from an external source, convert the data format of image signals to satisfy interface specifications with the data driver DDV, and provide the converted image signals to the data driver DDV.

The scan driver SDV may generate the scan signal in response to the scan control signal. The emission driver EDV may generate the emission signal in response to the emission control signal. The data driver DDV may receive the image signals with the converted data format and may generate data voltages (which correspond to the image signals) in response to the data control signal.

The pixels PX may receive the data voltages in response to the scan signals. The pixels PX may emit light (having luminance corresponding to the data voltages) in response to the emission signals to display an image. The light emission time of the pixel PX may be controlled, for example, based on the emission signals.

Figure 4:
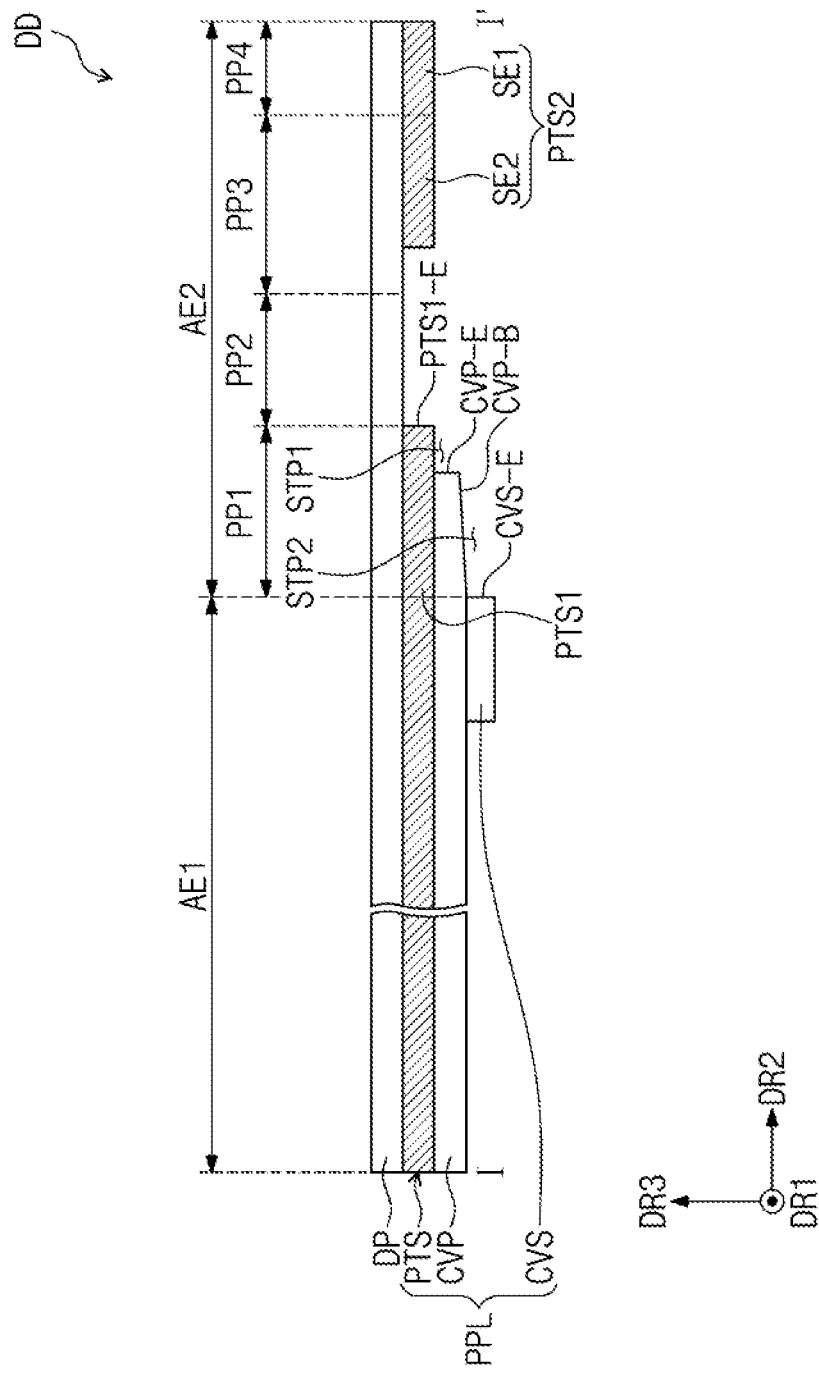
FIG. 4 illustrates a cross-sectional view taken along line I-I' of FIG. 3.

FIG. 4 is an embodiment of a cross-sectional view taken along line I-I' of FIG. 3. For convenience of description, the window WIN and anti-reflection layer POL on display panel DP are omitted, and an embodiment of a cross-sectional configuration of the display panel DP is schematically illustrated.

Referring to FIG. 4, the panel protective layer PPL may include a protective layer PTS, a cover panel CVP, and a cover spacer CVS. The protective layer PTS may be disposed below the display panel DP to protect a lower portion of the display panel DP. The protective layer PTS may include a flexible plastic substrate. In one embodiment, the protective layer PTS may include a colored or transparent polyimide.

The protective layer PTS may include a first protective layer PTS1 and a second protective layer PTS2. The first protective layer PTS1 may be below the first part PP1 of the second area AE2 and may extend below the first area AE1. The first protective layer PTS1 may overlap the first area AE1 and the first part PP1 of the second area AE2 of the display panel DP.

The second protective layer PTS2 may overlap the fourth part PP4 and a portion of the third part PP3 of the second area AE2. The second protective layer PTS2 may include a first zone SE1 below the fourth part PP4 and a second zone SE2 below the portion of the third part PP3. The first protective layer PTS1 and second protective layer PTS2 may be spaced apart from each other in the second direction DR2.

Adhesives may be disposed between the display panel DP and the first protective layer PTS1 and between the display panel DP and the second protective layer PTS2. The adhesive may include, for example, a pressure sensitive adhesive.

The cover panel CVP may be below the first protective layer PTS1 and may protect the display panel DP against an external impact. The cover panel CVP may overlap the first area AE1 and a portion of the first part PP1 of the second area AE2.

When viewed in the first direction DR1, an end PTS1-E of the first protective layer PTS1 may protrude further in the second direction DR2 than an end CVP-E of the cover panel CVP. Accordingly, a first stepped portion STP1 may be formed between the first protective layer PTS1 and the cover panel CVP.

According to an embodiment of the inventive concept, the cover panel CVP may include an inclined surface. For example, as illustrated in FIG. 4, a bottom surface CVP-B of the cover panel CVP overlapping the first part PP1 may be inclined at a predetermined angle with respect to the first area AE1. In FIG. 4, the bottom surface CVP-B may extend upwards toward the right side.

The cover spacer CVS may be below the cover panel CVP, and may overlap the first area AE1 and may not overlap the second area AE2. When viewed in the first direction DR1, the end CVP-E of the cover panel CVP may protrude further in the second direction DR2 than an end CVS-E of the cover spacer CVS. Accordingly, a second stepped portion STP2 may be formed between the cover panel CVS and the cover spacer CVS. The cover spacer CVS may allow the second protective layer PTS2 to be fixed to the cover panel CVP when a portion of the second area AE2 is bent. The cover spacer CVS may include, for example, a double-sided tape.

Figure 5:
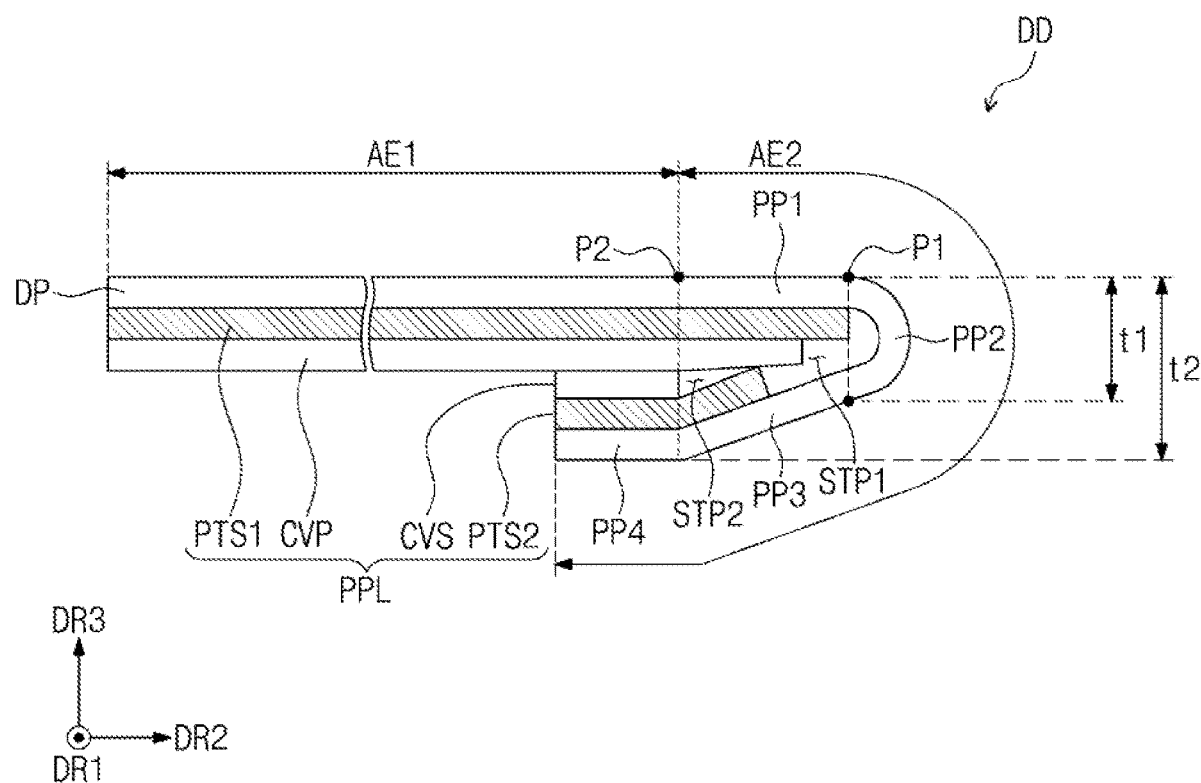
FIG. 5 illustrates an embodiment of a bent state of a display panel.

FIG. 5 is a cross-sectional view showing an embodiment in which a state of the display panel of FIG. 4 is bent. Referring to FIG. 5, in this embodiment a portion of the second area AE2 of the display panel DP is bent. When viewed in the first direction DR1, the first part PP1 adjacent to the first area AE1 may extend from the first area AE1 and may be substantially parallel to the first area AE1. The first area AE1 and the first part PP1 may be substantially parallel to each other in the second direction DR2.

The second part PP2 of the second area AE2 may extend from the first part PP1 and may be bent below the display panel DP. Accordingly, the third part PP3 may extend from the second part PP2 and may be below the first part PP1. The third part PP3 may overlap the first part PP1. The fourth part PP4 may be below the first area AE1 and may be substantially parallel to the first area AE1 and the first part PP1.

The third part PP3 may be inclined at a predetermined angle with respect to the first part PP1. In FIG. 4, the third part PP3 may extend leftwards and downwards from the second part PP2. Accordingly, the distance between the first part PP1 and the third part PP3 may be reduced gradually (e.g., reduced at a predetermined rate below a reference value) from an end of the third part PP3, which is adjacent to the fourth part PP4, toward the second part PP2 along the second direction DR2.

For example, a distance t1 from a first point P1 to a point corresponding to a bottom surface of the third part PP3 may be less than a distance t2 from a second point P2 to another point of the third part PP3. In one embodiment, the first point P1 may be a virtual point substantially corresponding to (or otherwise based on) a boundary between the first part PP1 and the second part PP2. The second point P2 may be a virtual point substantially corresponding to (or otherwise based on) a boundary between the first area AE1 and the first part PP1. The distance t1 may be, for example, proportional to the radius of curvature of second part PP2.

According to the embodiment of the inventive concept, the distance between the first part PP1 and the third part PP3 may be the smallest in a region adjacent to the second part PP2. Thus, the radius of curvature of the second part PP2 may be reduced or minimized. The width of the second part PP2 in the second direction DR2 may therefore be reduced or minimized. In one embodiment, the width of the second part PP2 in the second direction DR2 may substantially correspond to a bezel area.

This effect may be obtained by a structure of the panel protective layer PPL disposed between the first part PP1 and the third part PP3. Embodiments of the structure of the panel protective layer PPL being disposed between the first part PP1 and the third part PP3 will be described.

Figure 6:
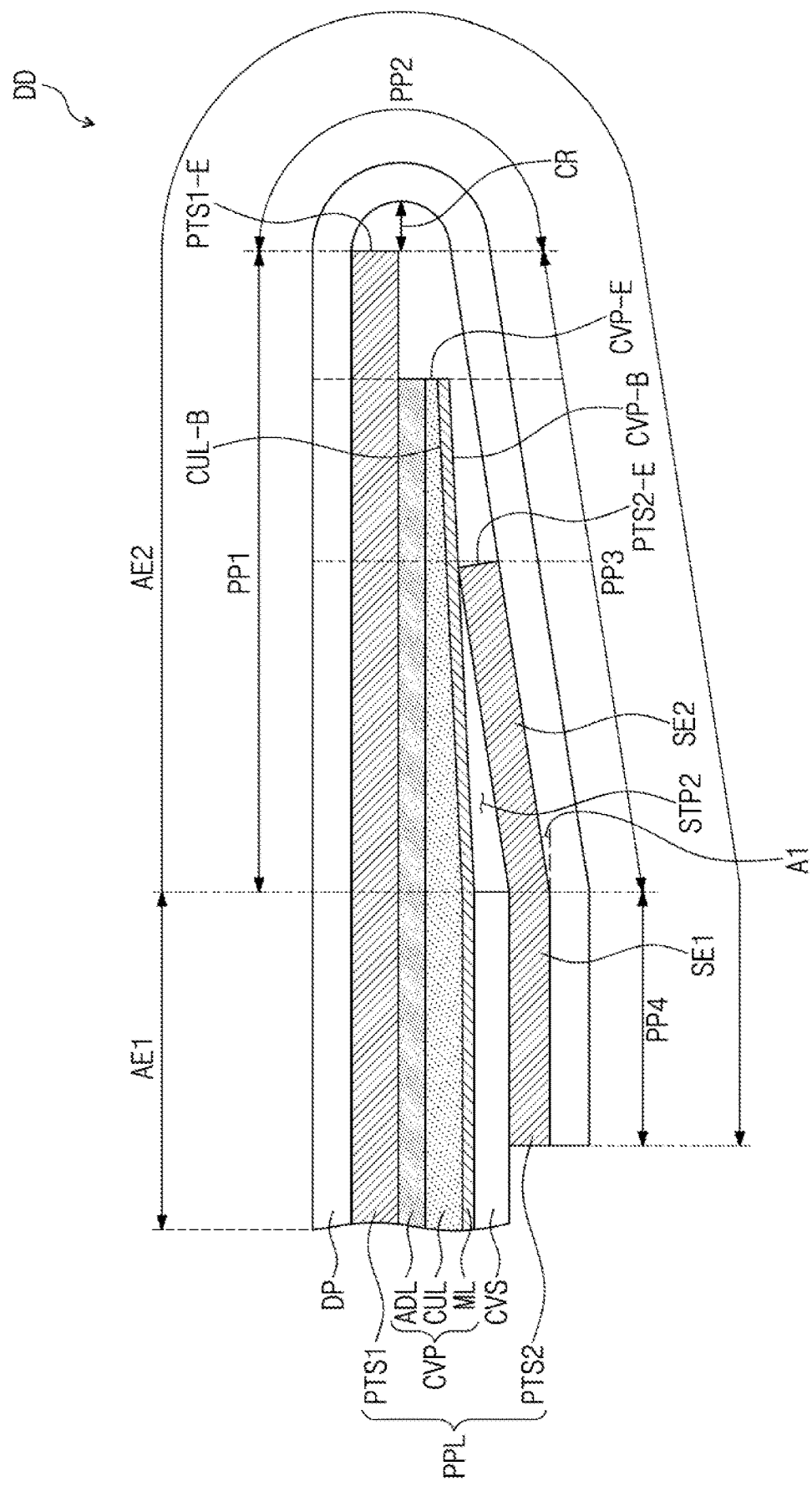
FIG. 6 illustrates various areas of an embodiment of a display panel.

FIG. 6 is a cross-sectional view of an embodiment of the second area and a portion of the first area adjacent to the second area of the display panel of FIG. 5.

Referring to FIG. 6, a thickness of the panel protective layer PPL disposed between the first part PP1 and the third part PP3 may be reduced toward the second part PP2 in the second direction DR2. The thickness of the panel protective layer PPL may represent the width of the panel protective layer PPL in the third direction DR3.

The following features may be in a zone from the boundary between the first area AE1 and the first part PP1 to an end PTS2-E of the second protective layer PTS2 in the second direction DR2: the first protective layer PTS1, the cover panel CVP, and the second protective layer PTS2. The following features may be in a zone from the end PTS2-E of the second protective layer PTS2 to the end CVP-E of the cover panel CVP in the second direction DR2: the first protective layer PTS1 and the cover panel CVP. Only the first protective layer PTS1 may be in a zone from the end CVP-E of the cover panel CVP to the end PTS1-E of the first protective layer PTS1. Thus, the thickness of the panel protective layer PPL may be reduced toward the second part PP2 because of the stepped structure between layers of the panel protective layer PPL.

According to an embodiment of the inventive concept, the cover panel CVP may include a plurality of functional layers: an adhesive layer ADL, a cushion layer CUL, and a metal layer ML. The adhesive layer ADL may be below the first protective layer PTS1 and may bond the first protective layer PTS1 to the cushion layer CUL, an example of which will be described below. The adhesive layer ADL may include, for example, a pressure sensitive adhesive. In one embodiment, the adhesive layer ADL may relieve an impact applied to the display panel DP. For example, the adhesive layer ADL may include an embossing pattern on the top surface or the bottom surface.

The cushion layer CUL may be below the adhesive layer ADL to absorb external impact applied from below the display panel DP and thus to protect the display panel DP. For example, the cushion layer CUL may include a foam sheet having a predetermined elastic force. A bottom surface CUL-B of the cushion layer CUL overlapping the first part PP1 may be an inclined surface. The bottom surface CUL-B may be inclined, for example, at a predetermined angle with respect to first part PP1.

The metal layer ML may be below the cushion layer CUL and may allow heat generated in the display panel DP to be discharged or dissipated to the outside. Also, the metal layer ML may be or include a grounding layer. To this end, the metal layer ML may include a metal material having high thermal conductivity. The metal material may include, for example, copper or another material. The metal layer ML overlapping the first part PP1 may be inclined at a predetermined angle with respect to the first part PP1 along the bottom surface CUL-B of the cushion layer CUL.

According to an embodiment of the inventive concept, because the bottom surface CVP-B of the cover panel CVP has the inclined structure, the thickness of the cover panel CVP may be reduced toward the second part PP2. Accordingly, the thickness of the panel protective layer PPL may be further reduced toward the second part PP2.

According to an embodiment of the inventive concept, the first zone SE1 of the second protective layer PTS2 may be attached to the cover spacer CVS as the second part PP2 is being bent. The second zone SE2 of the second protective layer PTS2 may be inclined with respect to the first part PP1 because of the formation of the second stepped portion STP2 between the cover panel CVP and the cover spacer CVS. In one embodiment, the second zone SE2 of the second protective layer PTS2 overlapping the first part PP1 may be curved toward the bottom surface CVP-B of the cover panel CVP.

In FIG. 5, the second zone SE2 may be folded rightwards and upwards from a boundary portion between the first zone SE1 and the second zone SE2. An end of the second zone SE2 may be in direct contact with the bottom surface CVP-B of the cover panel CVP.

In an embodiment of the inventive concept, a first angle A1 between the second zone SE2 of the second protective layer PTS2 and the first part PP1 may be greater than an angle between the bottom surface CVP-B of the cover panel CVP and the first part PP1.

According to an embodiment of the inventive concept, a portion of the third part PP3 may be supported by the second zone SE2. Accordingly, like the second zone SE2, the third part PP3 may be inclined at the first angle A1 with respect to the first part PP'.

According to an embodiment of the inventive concept, since the panel protective layer PPL has the stepped structure and the inclined structure as described above, the distance between the first part PP1 and the third part PP3 may decrease toward the second part PP2.

Thus, the thickness of the panel protective layer PPL between the first part PP1 and the third part PP3 may be smallest (e.g., less than a reference value) around the second part PP2, and therefore the radius CR of curvature of the second part PP2 may be formed to be small, e.g., under a predetermined value. Accordingly, the width of the second part PP2 in the second direction DR2 may decrease to reduce dead (e.g., unused) space. In addition, the thickness of the second part PP2 in the third direction DR3 may decrease to reduce the total thickness of the display device DD.

Figure 7:
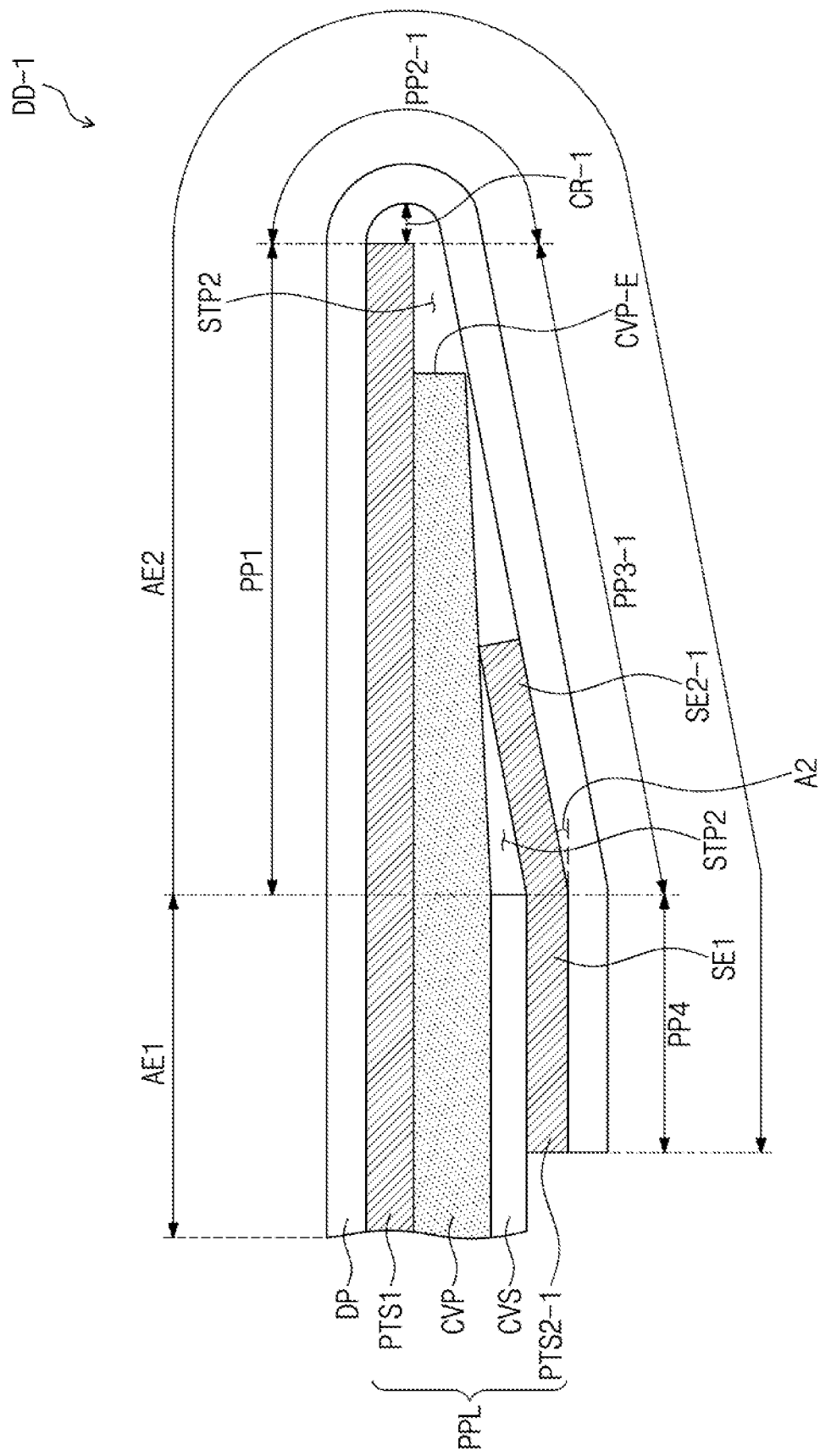
FIGS. 7 and 8 illustrate embodiments of a display device according to the inventive concept.
Figure 8:
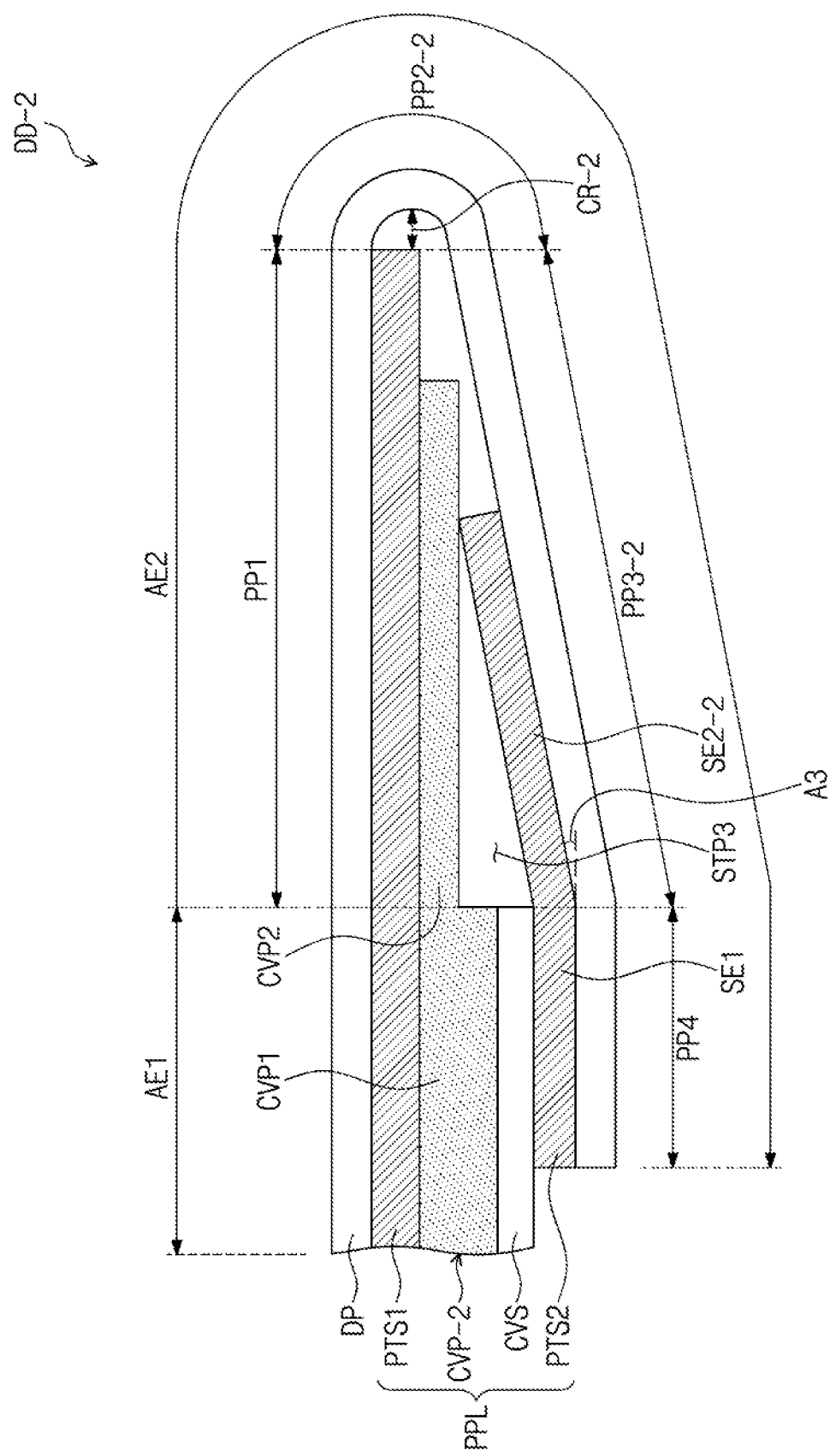

FIGS. 7 and 8 are cross-sectional views of display devices according to embodiments of the inventive concept. Descriptions of like components as those of the aforementioned embodiment will be omitted, and differences will be mainly described. Radii of curvature CR-1 and CR-2 of second parts PP2-1 and PP2-2 of display devices DD-1 and DD-2 as described below may be less than the radius CR of curvature of the second part PP2 of the display device DD according to one or more of the aforementioned embodiments.

Referring to FIGS. 6 and 7, a second zone SE2-1 of a second protective layer PTS2-1 of FIG. 7 may be shorter than the second zone SE2 illustrated in FIG. 6. Accordingly, a second angle A2 between the second zone SE2-1 and the first part PP1 may be greater than the first angle A1 illustrated in FIG. 6. Thus, an angle between a third part PP3-1 and the first part PP1 illustrated in FIG. 7 may increase, and the third part PP3-1 may be in contact with the end CVP-E of the cover panel CVP. Accordingly, through these features, the radius CR-1 of curvature of the second part PP2-1 may be further reduced.

According to an embodiment of the inventive concept, the extension length of the second zone SE2-1 of the second protective layer PTS2 may be less than that of the second zone SE2 of some of the aforementioned embodiments. Thus, the radius CR-1 of curvature of the second part PP2-1 may be less than the radius CR of curvature of the second part PP2.

Referring to FIGS. 6 and 8, a cover panel CVP-2 may include a first cover panel CVP1 and a second cover panel CVP2. The first cover panel CVP1 may overlap the first area AE1, and the second cover panel CVP2 may overlap the first part PP1 of the second area AE2. In the third direction DR3, the first cover panel CVP1 may have a thickness greater than that of the second cover panel CVP2. A third stepped portion STP3 may be formed between the first cover panel CVP1 and the second cover panel CVP2. During a manufacturing process of the display device DD-2, the third stepped portion STP3 may be formed, for example, by pressing a portion of the cover panel CVP-2 overlapping the first part PP1, that is, pressing the second cover panel CVP2.

According to the embodiment of the inventive concept, the distance between the first part and the third part of the display panel is reduced gradually (e.g., at a predetermined rate below a reference value) toward the second part corresponding to the bending area. Thus, the radius of curvature of the second part may be reduced or minimized. Accordingly, the width of the bezel of the display device may be reduced.

According to an embodiment of the inventive concept, due to the third stepped portion STP3, a third angle A3 between the second zone SE2-2 and the first part PP1 may be greater than the first angle A1 illustrated in FIG. 6. Accordingly, the radius CR-2 of curvature of the second part PP2-2 may be formed to be less than the radius CR of curvature of the second part PP2.

In accordance with one embodiment, a display panel includes a first area including a display area and a second area in a bent state and coupled to the first area. The first and second areas may correspond to those shown in the aforementioned drawings. For example, in one embodiment the first area may correspond to first area AE1 and the second area may correspond to second area AE2.

The second area may include a first part aligned in a plane including the display area, a second part that is curved, and a third part that is inclined relative to the first area. A first distance (between a first point of the first part and a first location of the third part) may be less than a second distance (between a second point of the first part and a second location of the third part), with the first point and the first location being closer to the second part than the second point and the second location. These features may correspond, for example, to those discussed in various of the aforementioned embodiments and drawings.

Although the embodiments of the present disclosure have been described, it is understood that various changes and modifications can be made by one ordinary skilled in the art within the spirit and scope of the present disclosure as hereinafter claimed. Also, the embodiments disclosed in the present disclosure are not intended to limit the technical ideas of the present disclosure, and technical ideas within the following claims and their equivalents should be interpreted to be included in the scope of right in the present disclosure. The embodiments may be combined to form additional embodiments.

What is claimed is:

1. A display device, comprising:
a display panel comprising a first area and a second area, the first area parallel to a plane including a first direction crossing a second direction, and the second area extending from the first area and comprising a first part adjacent to the first area in the second direction, a second part extending from the first part and in a bent state, and a third part extending from the second part and disposed below the first part; and
a panel protective layer between the first part and the third part, wherein a distance between the first part and the third part decreases from an end of the third part toward the second part along the second direction, and the third part has a flat surface and is inclined with respect to the first part,
wherein the panel protective layer comprises:
a first protective layer disposed under the first part; and
a cover panel disposed under the first protective layer,
wherein the cover panel extends to overlap the first area, and
wherein a thickness of the cover panel overlapping the first part is less than a thickness of the cover panel overlapping the first area.

2. The display device of claim 1, wherein:
a first distance extends from a first point to the third part, the first point based on or corresponding to a boundary between the first part and the second part,
a second distance extends from a second point to the third part, the second point based on or corresponding to a boundary between the first area and the first part, and
the first distance is less than the second distance in a third direction crossing the first area.

3. The display device of claim 1, wherein the first part is parallel to the first area when viewed in the first direction.

4. The display device of claim 3, wherein the third part is inclined at a predetermined angle with respect to the first part.

5. The display device of claim 4, wherein:
the display panel comprises a fourth part that extends from the third part, and
the first part and the fourth part are parallel to each other.

6. The display device of claim 1, wherein the panel protective layer has a thickness that decreases toward the second part.

7. The display device of claim 1, wherein the first protective layer includes an end that protrudes further toward the second part than an end of the cover panel when viewed in the first direction.

8. The display device of claim 1, wherein a bottom surface of the cover panel overlapping the first part is inclined at a predetermined angle with respect to the first area.

9. The display device of claim 8, wherein the cover panel comprises:
an adhesive layer below the first protective layer;
a cushion layer below the adhesive layer; and a metal layer below the cushion layer.

10. A display device, comprising:
a display panel comprising a first area and a second area, the first area parallel to a plane including a first direction crossing a second direction, and the second area extending from the first area and comprising a first part adjacent to the first area in the second direction, a second part extending from the first part and in a bent state, and a third part extending from the second part and disposed below the first part; and
a panel protective layer between the first part and the third part, wherein a distance between the first part and the third part decreases from an end of the third part toward the second part along the second direction, and the third part has a flat surface and is inclined with respect to the first part,
wherein the panel protective layer comprises:
a first protective layer disposed under the first part;
a cover panel disposed under the first protective layer; and
a second protective layer below the cover panel, and
wherein the third part is below the second protective layer.

11. The display device of claim 10, wherein:
each of the cover panel and the second protective layer extends to overlap the first area, and
the panel protective layer comprises a cover spacer between the cover panel and the second protective layer.

12. The display device of claim 11, wherein:
the cover spacer overlaps the first area and does not overlap the first part of the second area, and
the second protective layer overlapping the first part is curved toward a bottom surface of the cover panel.

13. A display device, comprising:
a display panel comprising a first area and a second area, the first area parallel to a plane formed by a first direction crossing a second direction, and the second area extending from the first area and comprising a first part adjacent to the first area in the second direction, a second part extending from the first part and in a bent state, and a third part extending from the second part and disposed below the first part; and
a panel protective layer between the first part and the third part, wherein the panel protective layer has a thickness that decreases from an end of the third part toward the second part along the second direction,
wherein the panel protective layer comprises:
a first protective layer disposed under the first part; and
a cover panel disposed under the first protective layer,
wherein the cover panel extends to overlap the first area, and
wherein a thickness of the cover panel overlapping the first part is less than a thickness of the cover panel overlapping the first area.

14. The display device of claim 13, wherein:
the first part is parallel to the first area,
the third part is inclined at a predetermined angle with respect to the first part, and
a distance between the first part and the third part decreases toward the second part.

15. The display device of claim 14, wherein
the first protective layer has an end which protrudes further toward the second part than an end of the cover panel.

16. A display device, comprising:
a display panel comprising a first area and a second area, the first area parallel to a plane formed by a first direction crossing a second direction, and the second area extending from the first area and comprising a first part adjacent to the first area in the second direction, a second part extending from the first part and in a bent state, and a third part extending from the second part and disposed below the first part; and
a panel protective layer between the first part and the third part, wherein the panel protective layer has a thickness that decreases from an end of the third part toward the second part along the second direction,
wherein the panel protective layer comprises:
a first protective layer disposed under the first part;
a cover panel disposed under the first protective layer; and
a second protective layer below the cover panel,
wherein the first protective layer has an end which protrudes further toward the second part than an end of the cover panel, and
wherein the cover panel includes an end that protrudes further toward the second part than an end of the second protective layer.

17. The display device of claim 16, wherein:
the panel protective layer comprises a cover spacer between the cover panel and the second protective layer,
the cover spacer overlaps the first area and does not overlap the first part, and
a portion of the second protective layer overlapping the first part is in contact with a bottom surface of the cover panel.

18. A display device, comprising:
a display panel comprising a first area and a second area, the first area parallel to a plane formed by a first direction crossing a second direction, and the second area extending from the first area and comprising a first part adjacent to the first area in the second direction a second part extending from the first part and in a bent state, and a third part extending from the second part and disposed below the first part; and
a panel protective layer between the first part and the third part, wherein the panel protective layer has a thickness that decreases from an end of the third part toward the second part along the second direction,
wherein the panel protective layer comprises:
a first protective layer disposed under the first part;
a cover panel disposed under the first protective layer; and
a second protective layer below the cover panel,
wherein the first protective layer has an end which protrudes further toward the second part than an end of the cover panel, and
wherein a bottom surface of the cover panel overlapping the first part is inclined at a predetermined angle with respect to the first part.

19. A display panel, comprising:
a first area including a display area;
a second area in a bent state and coupled to the first area;
a protective layer disposed under the first area; and
a cover panel disposed under the protective layer,
wherein the second area includes a first part aligned in a plane including the display area, a second part that is curved, and a third part that is inclined relative to the first area, wherein a first distance between a first point of the first part and a first location of the third part is less than a second distance between a second point of the first part and a second location of the third part, the first point and the first location closer to the second part than the second point and the second location,
wherein the cover panel extends to overlap the first area, and wherein a thickness of the cover panel overlapping the first part is less than a thickness of the cover panel overlapping the first area.

\* \* \* \* \*